Oct. 13, 1970 J. R. BIARD ET AL 3,534,280

OPTO THERMAL AUDIO AMPLIFIER

Filed Dec. 30, 1966 2 Sheets-Sheet 1

INVENTORS:
JAMES R. BIARD
JERRY D. MERRYMAN

E. Mickey Hubbard
ATTORNEY

Oct. 13, 1970 J. R. BIARD ET AL 3,534,280

OPTO THERMAL AUDIO AMPLIFIER

Filed Dec. 30, 1966 2 Sheets-Sheet 2

INVENTOR:
JAMES R. BIARD
JERRY D. MERRYMAN

E. Mickey Hubbard
ATTORNEY

United States Patent Office 3,534,280

Patented Oct. 13, 1970

3,534,280

OPTO THERMAL AUDIO AMPLIFIER

James R. Biard, Richardson, and Jerry D. Merryman, Dallas, Tex., assignors to Texas Instruments Incorporated, Dallas, Tex., a corporation of Delaware Filed Dec. 30, 1966, Ser. No. 606,354
Int. Cl. H03f *17/00*
U.S. Cl. 330—24 7 Claims

ABSTRACT OF THE DISCLOSURE

An amplifier in integrated circuit form with a relatively small input capacitor. A low frequency cutoff is achieved by a high input impedance produced by driving the base of the input transistor at a low current level through a photo diode. The current level is controlled by a negative feedback loop including a very low-pass thermal filter and optical coupling to the photo diode. The feedback loop features a push-pull configuration which improves the upper cutoff frequency and provides stability of operation as the efficiency of the optical coupling declines.

BACKGROUND OF THE INVENTION

The invention relates generally to amplifiers, and more specifically relates to audio amplifiers fabricated in integrated circuit form.

The low frequency cutoff value $f_{LC}$ of an amplifier using a capacitively coupled input is given by the expression:

$$f_{LC}=\frac{1}{2\pi RinC} \quad (1)$$

wherein $R_{in}$ is the input impedance of the amplifier and C is the capacitance of the coupling capacitor. Thus, it will be noted that the product of the capacitance and the input impedance must be high in order to achieve the low frequency cutoff value desired in a good audio amplifier. In integrated circuits, the values of both resistors and capacitors is severely limited due to the lack of adequate space and other considerations. Any conventional feedback loop for achieving D.C. stability further reduces the input impedance of the system.

SUMMARY OF INVENTION CLAIMED

An audio amplifier having an input capacitively coupled to the base of an input transistor, a photo diode connected to bias the base of the input transistor with a low current level proportional to the incident light on the photo diode, and a negative feedback loop including a low-pass thermal filter coupled to the input by a light source directed onto the photo diode. The specific aspects of the amplifier set forth in the abstract are also claimed in progressing detail.

DESCRIPTION OF A PREFERRED EMBODIMENT

Figure 1:
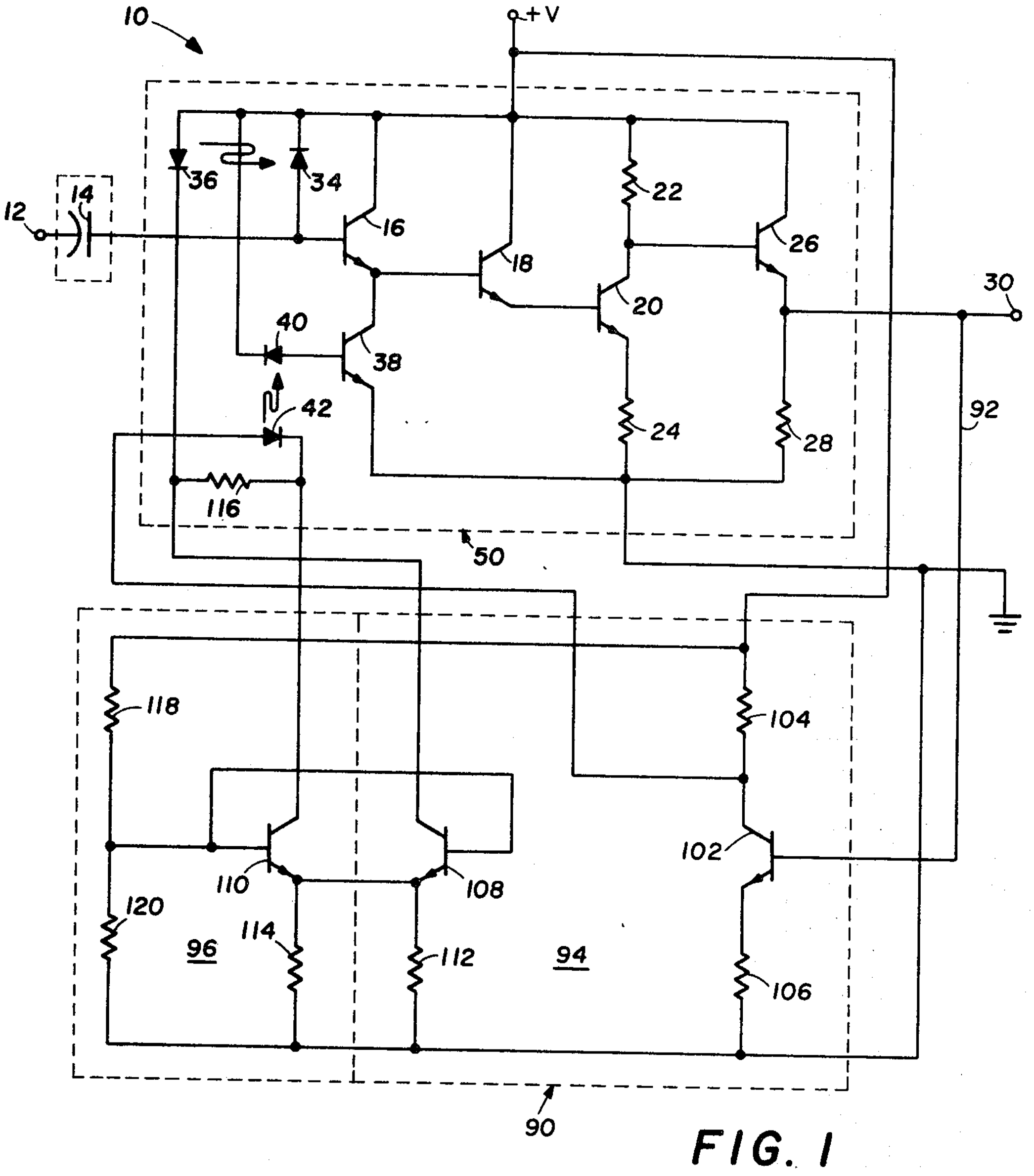
FIG. 1 is a schematic circuit diagram of one embodiment of an amplifier in accordance with this invention.

Referring now to the drawings, and in particular to FIG. 1, an amplifier in accordance with the present invention is indicated generally by the reference numeral 10. The amplifier 10 has an input terminal 12 which is A.C. coupled by a relatively small capacitor 14 to the base of an input transistor 16. Transistor 16 is connected in Darlington pair configuration with a second transistor 18 which drives the base of transistor 20. Transistor 20 forms the only amplifier stage of the amplifier which stage includes a collector resistor 22 and an emitter resistor 24. Resistor 24 provides a small amount of negative series feedback. The amplifier 20 drives the base of an emitter-follower transistor 26. The output voltage is developed across resistor 28 and appears at output terminal 30.

Base current to input transistor 16 is provided by photosensitive silicon diode 34. The level of current through diode 34 is dependent upon the level of light radiation striking the junction of diode 34 from a gallium arsenide diode 36. It will be noted that the diode 34 is reverse biased by the positive voltage supply and thus provides an extremely high input impedance, while supplying a very low current level to the base of transistor 16. The current level through transistor 16 is increased by transistor 38 the collector of which is connected to the emitter of transistor 16, and the emitter of which is connected to ground. The increased current through transistor 16 improves its performance and the upper frequency response of the amplifier. Base current to transistor 38 is provided by a second silicon diode 40 which is reverse biased by the positive voltage supply in the same manner as diode 34. The current through diode 40 to the base of transistor 38 is determined by the light striking the junction of the diode 40 from a gallium arsenide diode 42.

A negative feedback circuit to achieve D.C. stability is comprised of a low-pass thermal filter, indicated generally by the reference numeral 90, which is connected to the output 30 by conductor 92 and is coupled back to the input through the light coupled diode pairs 34–36 and 40–42. The low-pass thermal filter 90 is formed on two separate semiconductor chips 94 and 96. The chips 94 and 96 are separately mounted in the same standard integrated circuit flat pack 98 (FIG. 3) by a suitable insulating material 100. The thermal capacitance of the chip 94 and the thermal conductance of the insulating material 100 determines the frequency characteristics of the filter.

The conductor 92 connects the output to the base of a heater transistor 102 formed on chip 94. The collector of transistor 102 is connected through resistor 104 to the positive voltage supply terminal, and through resistor 106 to ground. Current through resistors 104 and 106 and through transistor 102 heats the chip 94 to a temperature above the ambient proportional to the D.C. voltage level at the output 30.

The current through the light emitting diode 36 is controlled by transistor 108 formed on the heated chip 94. The path for the current through light emitting diode 42 includes resistor 104, the diode 42, and transistor 110 which is formed on chip 96. The emitters of transistors 108 and 110 are common and are connected through parallel resistors 112 and 114 to ground. It will be noted that resistor 112 is formed on chip 94, and resistor 114 is formed on chip 96. The bases of transistors 108 and 110 are common and the collectors are interconnected by a resistor 116 formed on chip 50. The D.C. bias level for the bases of transistors 108 and 110 is provided by the voltage divider comprising resistors 118 and 120 which are formed on chip 96. Resistors 118 and 120 are also selected so that the power dissipated in the resistors will heat chip 96 to some reference temperature above ambient, the reference temperature being approximately the temperature of chip 94 when the output of the amplifier is at the desired D.C. level.

Figure 2:
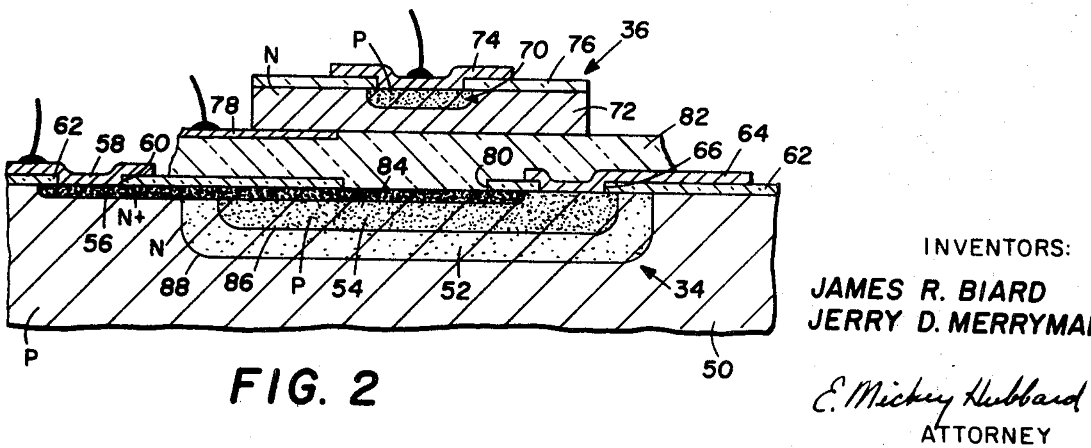
FIG. 2 is a sectional view of the diodes which optically couple the feedback loop to the input of the amplifier.

The optically coupled diode pair 34 and 36, and the optically coupled diode pair 40 and 42 may be fabricated as shown generally in FIG. 2 which illustrates the diode pair 34 and 36. The photosensitive silicon diode 34 may be formed in the same monolithic block 50 in which the NPN transistors of the amplifier circuit of FIG. 1 are formed. Starting with a p-type substrate, an n-type diffused region 52 is made at the same time the collector regions for the transistors are made. Next, a p-type diffused region 54 is formed within diffused region 52 by the same diffusion step used to make the base regions of the transistors, and finally a heavily doped n-type region 56 is formed during the same diffusion step used to make the emitter regions of the transistors. It will be noted that the p-type region 54 lies wholly within the n-type region 52, but that the heavily doped n-type region 56 overlies a major portion of the p-type region 54 and extends beyond the n-type region 52. A metallized contact 58 extends through an opening 60 in the oxide layer 62 and makes contact with the heavily doped n-type region 56 and thus with the more lightly doped, underlying n-type region 52. Contact 58 is connected to the positive voltage supply terminal. Similarly, an expanded metal contact 64 passes through an opening 66 in the oxide layer 62 and contacts the p-type region 54. Contact 64 is connected to the base of the transistor 16.

The light emitter diode 36 is formed by a diffused p-type region 70 in an n-type gallium arsenide chip 72. An expanded metal contact 74 extends through an oxide layer 76 into contact with the diffused region 70, and is connected to the positive voltage supply. A metal contact 78 may make contact with the backside of the chip 72 and extend from the edge of the chip as shown. The diode 36 is then mounted over an opening 80 formed in the oxide film 62 by a glassy bonding material 82.

As current is passed in the forward direction through diode 36, that is from contact 74 to contact 78, light in the infrared region is radiated at an intensity proportional to the current level through the diode. This infrared energy is radiated through the glassy material 82 and through the junction 84 formed between diffused regions 56 and 54, through junction 86 formed between diffused regions 54 and 52, and through junction 88 formed between diffused region 54 and the substrate 50. The photon carriers generated at junctions 84 and 86 result in a current flowing from contact 58 to contact 64 and thus into the base of transistor 16. The carriers generated as a result of the infrared energy striking junction 88 are conducted through the substrate to ground and are of no significant consequence. The total current generated between contacts 58 and 64 is proportional to the total infrared energy striking the junctions 84 and 86.

Figure 3:
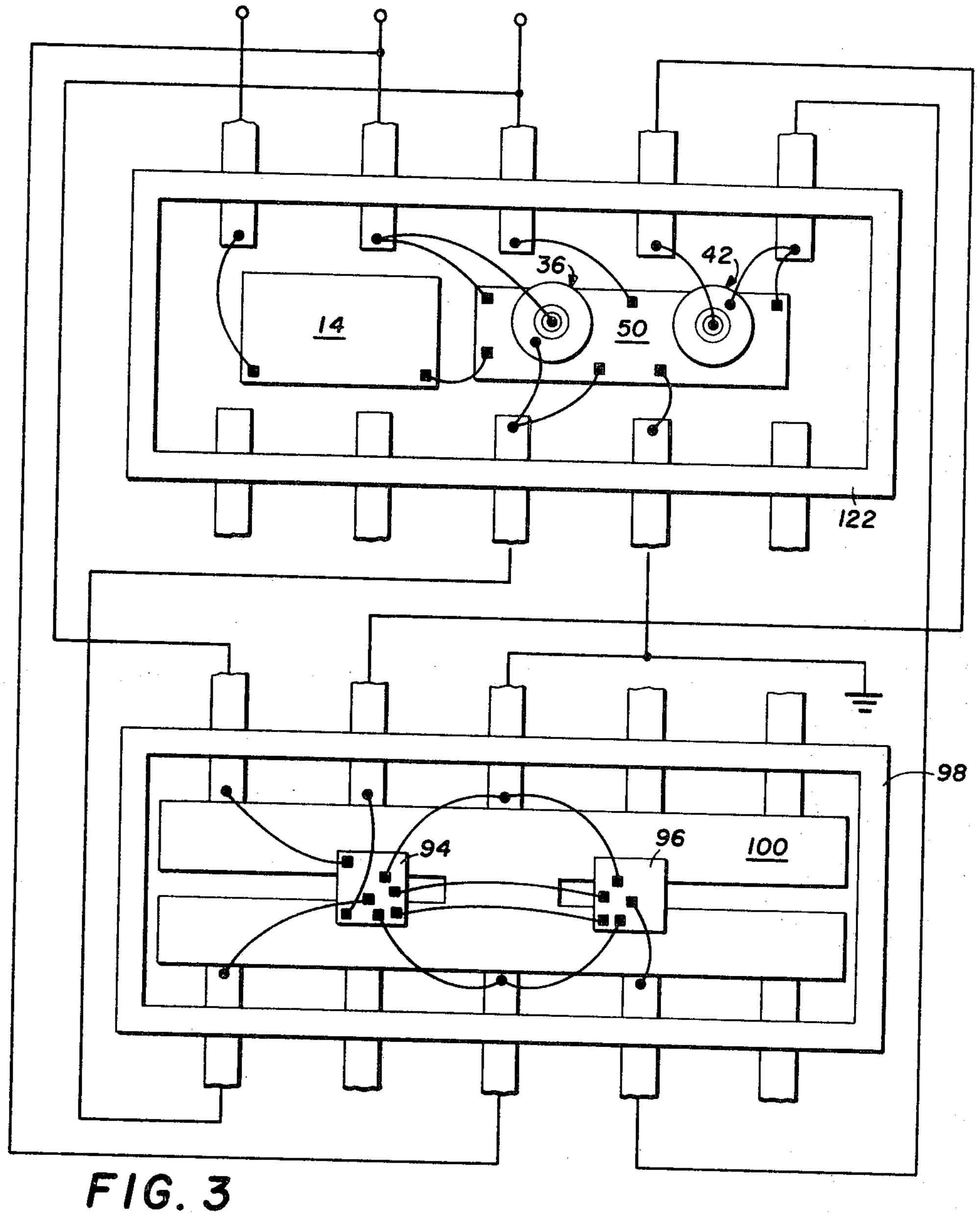
FIG. 3 is a top view of a pair of integrated circuit flat packs showing the manner in which the amplifier of FIG. 1 may be packaged.

As previously mentioned, the chips 94 and 96 of the thermal feedback filter are mounted in an integrated circuit package 98. The input capacitor 14 is conveniently fabricated on a separate chip and placed in the same integrated circuit package 122 as the chip 50 upon which the amplifier circuit and photosensitive diodes 34 and 40 are formed. The light emitting diodes 36 and 42 are mounted on the chip 50 substantially as shown in FIG. 3.

OPERATION

The A.C. signal is coupled through the input capacitor 14 to the base of input transistor 16. Transistors 16 and 18 are connected in Darlington pair configuration and drive the base of transistor 20, which is the sole amplifier stage. The amplifier stage is followed by the emitter-follower stage 26. This portion of the circuit operates in a conventional manner with regard to the A.C. signal.

The photo diode 34 provides a very low base current to operate transistor 16 and presents an impedance of several hundred megohms to the A.C. input signal. As a result, the effective input impedance of the amplifier is approximately that of the direct coupled transistor stages 16, 18 and 20. This input impedance is materially increased by operating the input transistor 16 with a very low base current. However, this reduces the upper cutoff frequency of the amplifier. Transistor 38 increases the collector-emitter current through transistor 16, and thus increases the gain of transistor 16 to improve the upper frequency response of the system without significantly affecting the A.C. input impedance.

In order to maintain a stable D.C. offset voltage at the output 30, the base currents to transistors 16 and 38 are controlled by negative feedback. Any A.C. coupling between the output and the input would materially reduce the A.C. input impedance of the system, making it impossbile to achieve the low frequency cutoff desired. The thermal feedback network provides a very low-pass filter, less than 1 c.p.s. for controlling the current through the light emitter diodes 36 and 42, and thus for controlling the base current to the transistors 16 and 38. If the D.C. level at the output 30 increases, the current through the heater stage 102 increases and the chip 94 is heated. Chip 96 remains at the reference temperature above the ambient within the integrated circuit package as a result of heating by current through resistors 118 and 120. As the temperature of chip 94 rises, the $V_{BE}$ of transistor 108 decreases, causing the current through light emitter diode 36 to increase. This increases the light striking photosensitive diode 34, and increases the current to the base of transistor 16, which as a result of the inversion of the sole amplifier stage, decreases the D.C. voltage level at the output 30. At the same time, the collector current through transistor 110 decreases, thus decreasing the light emitted from diode 42, which decreases the base current to transistor 38. The current through transistor 38 is therefore decreased, and transistors 18 and 20 conduct more heavily, thus assisting in decreasing the voltage at the output 30. Of course, if the voltage at the output 30 decreases, a complement series of events would occur, thus insuring that the D.C. voltage level at the output 30 remains substantially constant.

It will be noted that the thermal elements 94 and 96 are coupled in push-pull configuration to the transistors 16 and 38 by the diode pairs 34–36 and 40–42. This achieves the advantages inherent in a different arrangement, and is particularly useful in suppressing drift caused by variations with temperature of the light emitting efficiency of diodes 36 and 42, and variations in efficiency over the life of the diodes. The feedback assures a suppression of the effect of undesirable signals on the output by the factor $1\Theta - A\beta$, where A is the voltage gain of the amplifier and $\beta$ is the feedback ratio at D.C.

Figure 4:
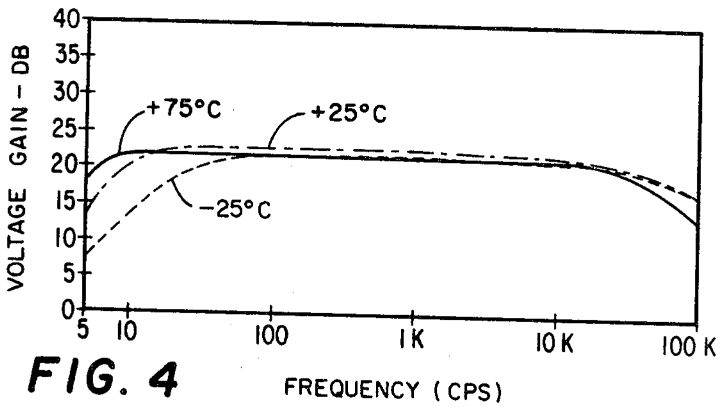
FIG. 4 is a plot showing the frequency response of the amplifier of FIG. 1 at various ambient temperatures.

In one particular embodiment of the invention, the frequency response illustrated in FIG. 4 was achieved at the various ambient temperatures. The lower cutoff frequency of the system is determined by the value of the input coupling capacitor 14 and the value of the effective input impedance, and is independent of the frequency characteristics of thermal feedback network. The value of ten cycles per second indicated in FIG. 4 results from an input capacitance of 500 pico-farads in series with an input impedance of 4 megohms. The upper frequency response is dependent only upon the transistor parameters and circuit configuration.

Figure 5:
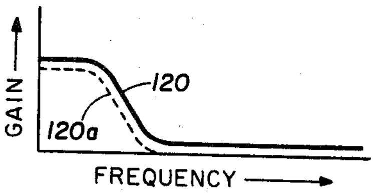
FIG. 5 is a plot showing the frequency response of the feedback loop of the amplifier of FIG. 1.

The frequency response shown in FIG. 4 below about 50 c.p.s. was achieved only by modifying the frequency response of the low-pass thermal filter in the feedback circuit to avoid a peak in the gain at about 30 c.p.s. due to a regenerative condition. The response of the thermal filter is represented by the dotted continuation 120*a* of curve 120 in FIG. 5. However, the small load resistor 104 provides a constant feedback voltage over the full frequency range. This voltage signal is applied as a negative feedback to both light emitting diodes 36 and 42 by the resistor 116 to provide A.C. stability. The feedback signal is very small because of the very high impedance of resistor 116 and of transistor 110 when compared with the low impedance of load resistor 104. Thus, it will be noted that this small A.C. feedback signal is shunted around the low-pass thermal filter and the combined frequency response of the feedback loop is substantially as represented by curve 120.

Although a preferred embodiment of the invention has been described in detail using rather specific language, this language is not intended, nor should it be construed to limit the invention as defined by the appended claims.

What is claimed is:

1. In an audio amplifier having an input and an output, the combination of: an input transistor; a capacitor coupling the base of said input transistor to the input of said amplifier; a controllable current source having a high impedance connected to supply a low current level to the base of said input transistor; and a negative feedback loop coupling the output of said amplifier to said controllable current source for maintaining the D.C. level of the output substantially constant; wherein said feedback loop includes a low-pass filter for presenting a high impedance to audio frequencies; and wherein said low-pass filter comprises a thermal capacitance and a heater driven by the output of said amplifier for heating said thermal capacitance to a temperature proportional to the voltage level of the output, and means for sensing the temperature of said thermal capacitance for operating said controllable current source and thereby controlling the current level to the base of said input transistor.

2. In an audio amplifier having an input and an output, the combination of: an input transistor; a capacitor coupling the base of said input transistor to the input of said amplifier; a controllable current source having a high impedance connected to supply a low current level to the base of said input transistor; and a negative feedback loop coupling the output of said amplifier to said controllable current source for maintaining the D.C. level of the output substantially constant; wherein said feedback loop includes a low-pass filter for presenting a high impedance to audio frequencies; and wherein said controllable current source comprises a reverse biased photo diode; and wherein said negative feedback loop comprises a thermal capacitance, heater means connected to the output of said amplifier for heating the thermal capacitance to a temperature related to the voltage level of the output of said amplifier, a light source optically coupled to said photo diode, and temperature sensing means for sensing the temperature of said thermal capacitance and driving said light source to produce light the level of which is related to the temperature of said thermal capacitance.

3. The audio amplifier comprising an input and an output, an input stage comprising first and second transistors, the collector of the first transistor being connectable to a collector voltage supply, the emitter of the first transistor being connected to the collector of the second transistor, and the emitter of the second transistor being connectable to an emitter voltage supply, a capacitor coupling the base of the first transistor to the input, first and second controllable current sources having high impedances connected to the base of the first and second transistors, respectively, for supplying a low current level thereto and a negative feedback coupling the output to the first and second controllable current sources for maintaining the D.C. level of the output substantially constant by oppositely varying the current supplied by the controllable current sources, the negative feedback loop including a low-pass filter presenting a high impedance to audio frequencies.

4. The audio amplifier defined in claim 3 wherein the first and second controllable current sources comprise first and second photo diodes, respectively, connected to the base of the first and second transistors, respectively, and the feedback loop is optically coupled to thephoto diode by first and second light sources, respectively.

5. The audio amplifier defined in claim 4 wherein the negative feedback loop comprises a thermal capacitance, heater means connected to the output of the amplifier for heating the thermal capacitance to a temperature related to the D.C. voltage level of the output, first sensing means for sensing the temperature of the thermal capacitance and driving the first light source such that the level of light emitted by the light source is related to the temperature of the thermal capacitance, and second means coupled to the first sensing means for driving the second light source such as to decrease the light from the second light source as the light from the first lighat source increases and increase the light from the second light source as the light from the first light source decreases.

6. The audio amplifier defined in claim 5 wherein the first sensing means comprises a first diode junction in heat exchange relationship with the thermal capacitance, the light source, the diode junction and a resistance being connected in a series circuit connectable across a voltage supply for the light source, and the second means comprises a second diode junction thermally isolated from the thermal capacitance, the second light source, the second diode and said resistance being connected in a series circuit connectable across said voltage supply of the light source, whereby as the temperature of the thermal capacitance increases, the current through the first light source will increase and the current through the second light source will decrease.

7. In an opto-thermal audio amplifier having a low frequency cutoff with a high input impedance at a low current level, the combination comprising:

(a) input and output circuits;

(b) a pair of input transistors connected in series across a voltage supply;

(c) an A.C. coupling means coupling said input circuit to the base of one of said transistors;

(d) circuit means coupling said output circuit to the junction of said transistors;

(e) a pair of reverse biased photo diodes respectively connected between said voltage supply and the bases of said transistors for supporting low current levels thereto; and (f) a negative feedback loop including low-pass filter means coupled between said output circuit and each of said photo diodes for maintaining the D.C. level of the output of said audio amplifier substantially constant.

References Cited

UNITED STATES PATENTS

| | | | |
|---|---|---|---|
| 2,847,519 | 2/1956 | Aronson | 330—17 X |
| 3,341,785 | 9/1967 | Merryman et al. | 330—38 |
| 3,040,264 | 6/1962 | Weidner | 330—25 |
| 3,082,381 | 3/1963 | Morrill et al. | 330—59 |
| 3,283,135 | 11/1966 | Sklaroff | 330—59 X |
| 3,410,961 | 11/1968 | Slana | 307—311 |

OTHER REFERENCES

Merryman: "Making Light of the Noise Problem," Electronics, pp. 52–55, July 1965.

ROY LAKE, Primary Examiner

L. J. DAHL, Assistant Examiner

U.S. Cl. X.R.

330—28, 59